(12) United States Patent
Lee et al.

(10) Patent No.: US 11,901,833 B2
(45) Date of Patent: Feb. 13, 2024

(54) INTEGRATED POWER SYSTEM CAPABLE OF SWITCHING BETWEEN POWER SUPPLY MODE AND ELECTRONIC LOAD MODE AND SWITCHING METHOD THEREOF

(71) Applicant: CHROMA ATE INC., Taoyuan (TW)

(72) Inventors: Cheng Chung Lee, Taoyuan (TW); Szu Chieh Su, Taoyuan (TW); Wen Chih Chen, Taoyuan (TW); Chih Hsing Lin, Taoyuan (TW); Jhen Wei Gong, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 17/938,055

(22) Filed: Oct. 5, 2022

(65) Prior Publication Data

US 2023/0134013 A1 May 4, 2023

(30) Foreign Application Priority Data

Nov. 3, 2021 (TW) ................. 110140897

(51) Int. Cl.
*H02M 5/44* (2006.01)
*H02M 1/00* (2006.01)

(52) U.S. Cl.
CPC .......... *H02M 5/44* (2013.01); *H02M 1/0009* (2021.05)

(58) Field of Classification Search
None
See application file for complete search history.

(56) References Cited

U.S. PATENT DOCUMENTS 10,211,824 B2 * 2/2019 Tsurumaru .............. H02M 1/08

* cited by examiner

*Primary Examiner* — Jeffery S Zweizig
(74) *Attorney, Agent, or Firm* — McClure, Qualey & Rodack, LLP

(57) ABSTRACT

Systems and methods for switching between a power supply mode and an electronic load mode are disclosed. For switching from the power supply mode to the electronic load mode, the method comprises the steps of: deactivating a power element; activating a current control module and a phase-locked loop to obtain a voltage phase of a device under test; calculating a turn-on amount of the power element according to a current setting value and the voltage phase; and causing the power element to generate a load current for the device under test. For switching from the electronic load mode to the power supply mode, the method comprises the steps of: deactivating the power element; activating a voltage control module; calculating the turn-on amount of the power element according to a voltage setting value; and causing the power element to input a corresponding voltage to the device under test.

10 Claims, 5 Drawing Sheets

INTEGRATED POWER SYSTEM CAPABLE OF SWITCHING BETWEEN POWER SUPPLY MODE AND ELECTRONIC LOAD MODE AND SWITCHING METHOD THEREOF

BACKGROUND OF THE INVENTION

Field of the Invention

The present invention relates to an integrated power system capable of switching between a power supply mode and an electronic load mode and to a switching method thereof, particularly to a power system in which an AC/DC power supply mode and an AC/DC electronic load mode are integrated and which can switch the mode without the system being shut down.

DESCRIPTION OF THE RELATED ART

In the field of electronic device testing, an AC/DC power supply and an AC/DC electronic load have played an important role. An AC/DC power supply simply functions to supply stable electric power to an electronic device under test while an AC/DC electronic load is a device which simulates a state of energy consumption in order to simulate an electricity consumption environment. However, conventionally, the AC/DC power supply and the AC/DC electronic load are mostly independent electronic machines. There are few electronic machines that integrate these two functions because one of these two functions opposite to each other is to supply electric power and the other of these two functions is to consume electric power. In addition, the existing AC/DC power supply and AC/DC electronic load cannot be integrated for the reason that difference between the AC/DC power supply and the AC/DC electronic load in terms of the control mode does not allow the hardware design to be shared by the AC/DC power supply and the AC/DC electronic load.

Taiwanese Patent Publication No. 201434228, entitled "Power Conversion System Containing Power Supply and Electronic Load", discloses a power conversion system in which a power supply and an electronic load are combined. However, the technology of this patent utilizes two power converters as the power supply and the electronic load respectively. Briefly, the above-mentioned patent literature combines a power supply and an electronic load each of which is an independent kit and operates independently from each other and by which only a few components are shared. As such, it is hard to say that the power supply and the electronic load are substantially integrated. Furthermore, the above-mentioned patent literature addresses the issue that when the electronic load function is used, electric power is recovered as the source power of the power supply, and the mode switching method thereof is not disclosed in detail therein.

As such, an integrated power system which can integrate a power supply and an electronic load into a single electronic device with hardware components being shared and which is capable of switching between a power supply mode and an electronic load mode in a digital control manner without the system being shut down is highly expected in the industry and the public.

SUMMARY OF THE INVENTION

A main object of the present invention is to provide an integrated power system which is capable of switching between a power supply mode and an electronic load mode and a switching method thereof and which can integrate an AC/DC power supply and an AC/DC electronic load into a single device with hardware components being shared.

Another main object of the present invention is to switch between the AC/DC power supply mode and the AC/DC electronic load mode in a digital control manner without the system being shut down and with no hardware being replaced or adjusted during the switching process.

In order to achieve the above objects, the present invention provides an integrated power system capable of switching between a power supply mode and an electronic load mode, which mainly comprises an AC/DC conversion module, a DC/DC conversion module and a DC/AC conversion module. The AC/DC conversion module is electrically coupled to an external power source; the DC/DC conversion module is electrically coupled to the AC/DC conversion module; and the DC/AC conversion module is electrically coupled to the DC/DC conversion module and a device under test. Also, the DC/AC conversion module may include a microprocessor, a power element, a power element-driving circuit, a voltage-detecting circuit and a current-detecting circuit; the power element-driving circuit is electrically coupled to the microprocessor and the power element and is controlled to drive the power element; the power element is electrically coupled to the device under test; the voltage-detecting circuit and the current-detecting circuit are electrically coupled between the power element and the device under test. In the power supply mode, the microprocessor controls the power element-driving circuit according to a voltage setting value so that the power element inputs a corresponding voltage to the device under test, and the voltage-detecting circuit and the current-detecting circuit monitor an output voltage value and an output current value output to the device under test respectively and feed the output voltage value and the output current value to the microprocessor. In the electronic load mode, the microprocessor controls the voltage-detecting circuit to detect an input voltage value input by the device under test, the microprocessor obtains a voltage phase according to the input voltage value, and the microprocessor controls the power element-driving circuit according to a current setting value and the voltage phase so that the power element generates a load current for the device under test.

Accordingly, the present invention realizes integration of the AC/DC power supply and the AC/DC electronic load into a single system wherein most of hardware components in the system are shared by the AC/DC power supply and the AC/DC electronic load. The present invention executes the functions of the two modes and switches between the two modes in a digital control manner and is a novel integrated power system.

In order to achieve the above object, the present invention provides a method for switching an integrated power system between a power supply mode and an electronic load mode, wherein the integrated power system mainly includes a DC/AC conversion module, which is electrically coupled to a device under test, the DC/AC conversion module includes a microprocessor and a power element, and the microprocessor mainly includes a voltage control module, a current control module and a phase-locked loop. For switching from the power supply mode to the electronic load mode, the method comprises the steps of: deactivating the power element by the microprocessor; activating the current control module; activating the phase-locked loop by the microprocessor and obtaining a voltage phase of the device under test; calculating the turn-on amount of the power element according to a current setting value and the voltage phase by the current control module; and causing the power element to generate a load current for the device under test by the microprocessor. For switching from the electronic load mode to the power supply mode, the method comprises the steps of: deactivating the power element by the microprocessor; activating the voltage control module; calculating the turn-on amount of the power element according to a voltage setting value by the voltage control module; and causing the power element to input a corresponding voltage to device under test by the microprocessor.

Accordingly, the present invention can switch between the power supply mode and the electronic load mode in a digital control manner via a user interface with no hardware component being modified or manually reconfigured so that the switching process is quite simple and fast, and it is unnecessary to reboot or reset the system. In addition, in the present invention, a preset output current and a preset output voltage can be calculated by the current control module and the voltage control module respectively, so that the power element outputs a precise corresponding voltage in the power supply mode and generates a precise load current in the electronic load mode.

DESCRIPTION OF THE PREFERRED EMBODIMENTS

Figure 1:
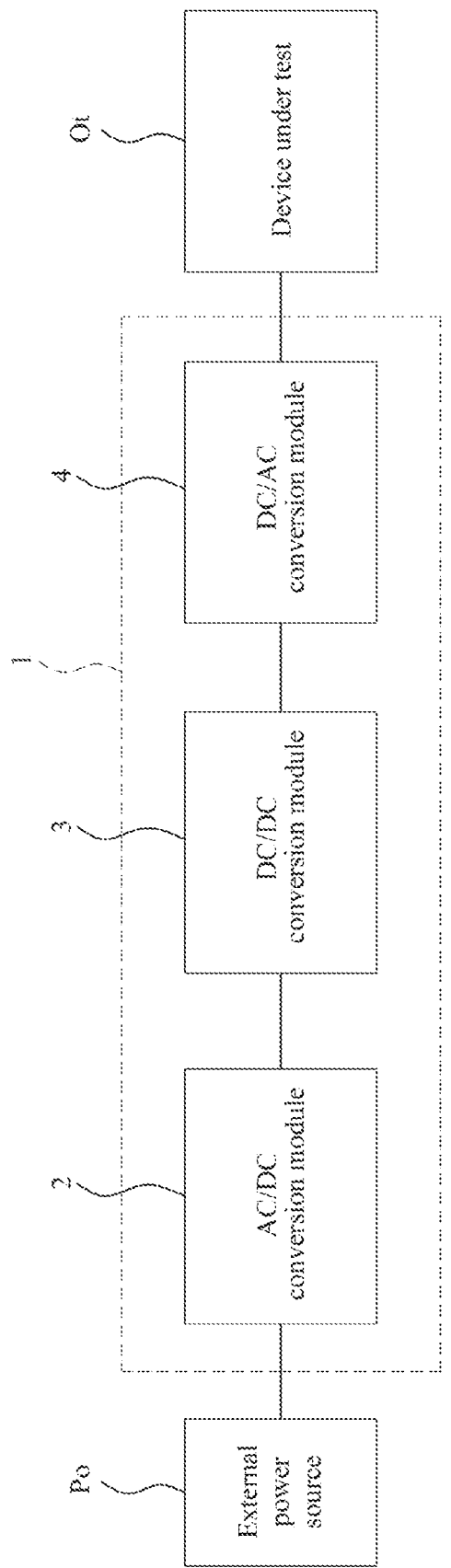
FIG. 1 is a block diagram of a system according to a preferred embodiment of the present invention.

Before an integrated power system capable of switching between a power supply mode and an electronic load mode and a switching method thereof according to the present invention are described in detail in the embodiments, it should be noted that in the following description, similar components will be designated by the same reference numerals. Furthermore, the drawings of the present invention are for illustrative purposes only, they are not necessarily drawn to scale, and not all details are necessarily shown in the drawings.

Reference is made to FIG. 1, which is a block diagram of an integrated power system capable of switching between a power supply mode and an electronic load mode according to a preferred embodiment of the present invention. In this figure, the essential components of the integrated power system of this embodiment and the connection relationship among these components and external components are shown. The integrated power system 1 of this embodiment mainly comprises an AC/DC conversion module 2, a DC/DC conversion module 3 and a DC/AC conversion module 4. The AC/DC conversion module 2 provided at the input end is electrically couple to an external power source Po, which may be the mains of single-phase or three-phase alternating current, and the AC/DC conversion module 2 of this embodiment is an AC/DC power conversion module with active power factor correction (PFC).

On the other hand, the DC/DC conversion module 3 of this embodiment is electrically coupled between the AC/DC conversion module 2 and the DC/AC conversion module 4, and the DC/DC conversion module 3 of this embodiment is a buck-boost DC isolating transformer. The DC/AC conversion module 4 provided at the output end is an essential feature of this embodiment and electrically coupled to a device under test Ot which may be a load under test or a power supply under test.

Figure 2:
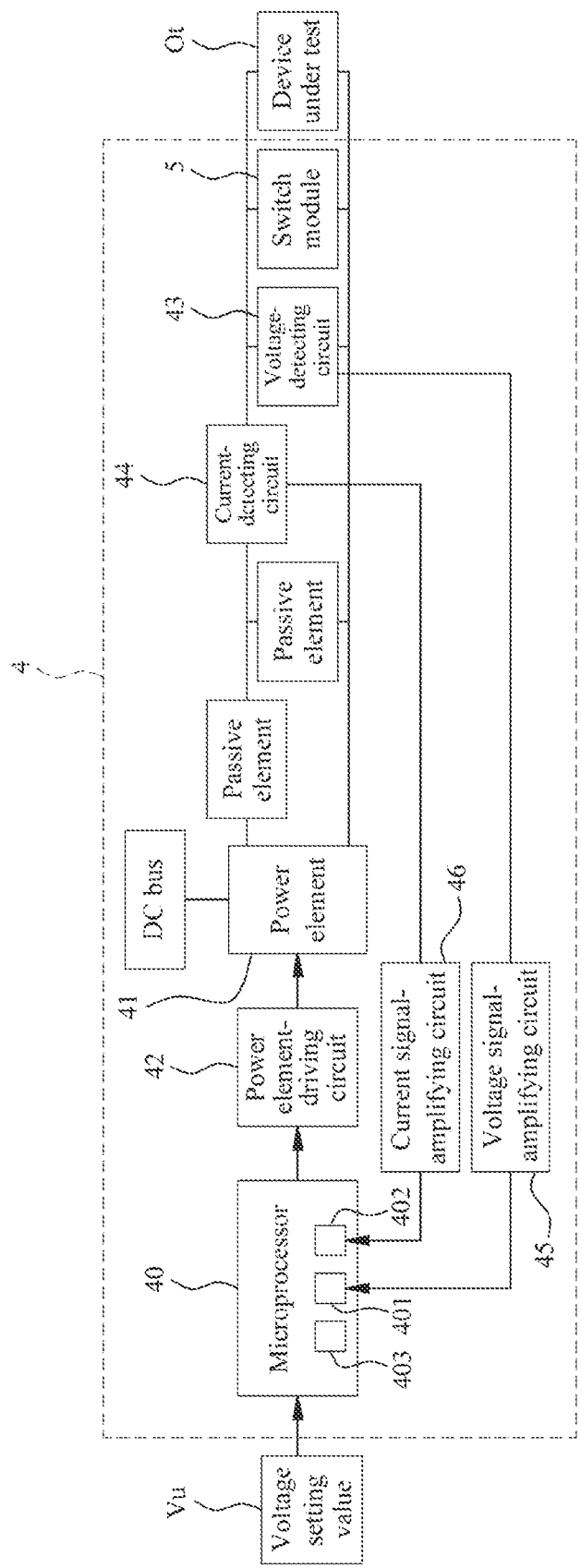
FIG. 2 is a block diagram of the system in a power supply mode according to a preferred embodiment of the present invention.

Reference is made to FIG. 2, which is a block diagram of the system in the power supply mode according to a preferred embodiment of the present invention. The hardware architecture and operation of this embodiment in the power supply mode will be described below. As shown in the figure, in the power supply mode, the hardware configuration of the DC/AC conversion module 4 mainly includes a microprocessor 40, a power element 41, a power element-driving circuit 42, a voltage-detecting circuit 43, a current-detecting circuit 44, a switch module 5, a current signal-amplifying circuit 46, a voltage signal-amplifying circuit a plurality of passive elements and a plurality of DC buses. The microprocessor 40 includes three main functional modules, i.e. a voltage control module 401, a current control module 402 and a phase-locked loop 403.

The power element-driving circuit 42 is electrically coupled to the microprocessor 40 and the power element 41, the power element 41 is electrically coupled to the device under test Ot, and the voltage-detecting circuit 43, the current-detecting circuit 44 and the switch module 5 are electrically coupled between the power element 41 and the device under test Ot. The switch module 5 in this embodiment is a relay, which can be switched on by the microprocessor 40 so that the DC/AC conversion module 4 is connected to the device under test Ot or be switched off by the microprocessor 40 so that the DC/AC conversion module 4 is disconnected from the device under test Ot.

The current signal-amplifying circuit 46 is electrically coupled between the current-detecting circuit 44 and the microprocessor 40 and is used to amplify a current detection signal and to supply the current detection signal to the microprocessor 40. The current detection signal may be, for example, an output current value output to the device under test Ot in the power supply mode or an input current value input by device under test Ot in the electronic load mode. The voltage signal-amplifying circuit 45 is electrically coupled between the voltage-detecting circuit 43 and the microprocessor 40 and is used to amplify a voltage detection signal and to supply the voltage detection signal to the microprocessor 40. The voltage detection signal may be, for example, an output voltage value output to the device under test Ot in the power supply mode or an input voltage value input by the device under test Ot in the electronic load mode.

The operation of the power supply mode of this embodiment will be described below. Reference is made to FIG. 2 again. The microprocessor 40 controls the power element-driving circuit 42 according to a voltage setting value Vu input by the user in advance so that the power element 41 outputs a corresponding voltage to the device under test Ot. Specifically, in this embodiment, the voltage control module 401 is used to perform the function operation and the steady-state error compensation on the voltage setting value Vu, thereby obtaining the turn-on amount of the power element 41 (i.e. the duty ratio of the semiconductor switching element) and outputting a PWM (Pulse-width modulation) voltage control signal to the power element-driving circuit 42 so that a corresponding voltage equal to the voltage setting value Vu is output to the device under test Ot by the power element 41.

During the operation of the power supply mode, the voltage-detecting circuit 43 and the current-detecting circuit 44 respectively monitor the output voltage value and the output current value output to the device under test Ot in real time and feed the output voltage value and the output current value to the microprocessor 40. Once an error between the detected output voltage value and the voltage setting value or an error between the detected output current value and the current setting value, the microprocessor 40 can make an adjustment immediately so as to eliminate the error.

Figure 3:
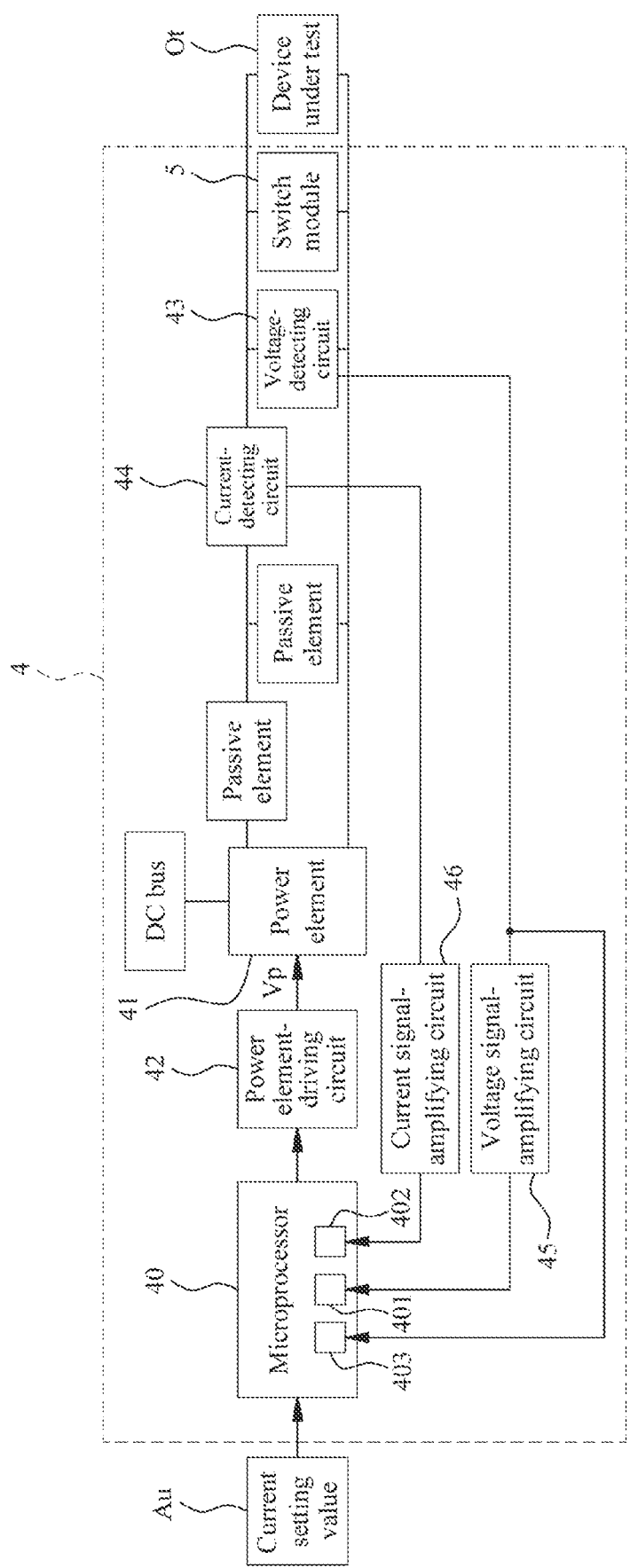
FIG. 3 is a block diagram of the system in an electronic load mode according to a preferred embodiment of the present invention.

Reference is to FIG. 3, which is a block diagram of the system in the electronic load mode according to a preferred embodiment of the present invention. The hardware architecture and operation of this embodiment in the electronic load mode will be described below. As shown in the figure, the hardware architecture of this embodiment in the electronic load mode is nearly the same as the hardware architecture in the power supply mode, and the difference lies only in the functional modules within the microprocessor 40. In the power supply mode, the voltage control module 401 is used for operation and processing while in the electronic load mode, the current control module 402 and the phase-locked loop 403 are used for operation and processing. It can be seen that in the integrated power system provided in this embodiment, the electronic load mode and the power supply mode share almost all the hardware components, and integration of the power supply mode and the electronic load mode into a single device with the hardware components being shared is achieved.

The operation of the electronic load mode of this embodiment will be illustrated below. Reference is made to FIG. 3 again. The microprocessor 40 controls the voltage-detecting circuit 43 to detect an input voltage value input by the device under test Ot. The microprocessor 40 can obtain a voltage phase according to the input voltage value. The microprocessor 40 controls the power element-driving circuit 42 according to a current setting value Au preset by the user and the voltage phase so that the power element 41 generates a load current for the device under test Ot.

Specifically, the voltage-detecting circuit 43 detects the input voltage value of the device under test Ot in real time and feeds the input voltage value to the microprocessor 40. Since the phase-locked loop 403 in the microprocessor 40 includes a phase detector, a loop filter and a voltage-controlled oscillator, the voltage phase of the input voltage value can be obtained immediately through the operation when the input voltage value is input to the phase-locked loop 403.

At this time, the current control module 402 can obtain the turn-on amount of the power element (i.e. the duty ratio of the semiconductor switching element) through the function operation and the steady-state error compensation according to the current setting value Au and the voltage phase and then control the power element-driving circuit 42 by outputting a current control signal to the power element-driving circuit 42, and the power element-driving circuit 42 thereby outputs a matching voltage Vp to the power element 41 so that the power element 41 generates a load current for the device under test Ot, which is substantially equal to the current setting value Au. The current control signal is also a PWM current control signal.

Similarly, during the operation of the electronic load mode, the voltage-detecting circuit 43 and the current-detecting circuit 44 respectively monitor the input voltage and the input current of the device under test Ot in real time and feed the input voltage and input current to the microprocessor 40. On the one hand, the microprocessor 40 obtains the voltage phase according to the input voltage and then drives the power element 41. On the other hand, the microprocessor 40 determines whether to activate a protection mechanism according to the input voltage and the input current. Once the detected input voltage value or the detected input current value changes greatly, the microprocessor 40 can handle it immediately to avoid system failure.

Figure 4:
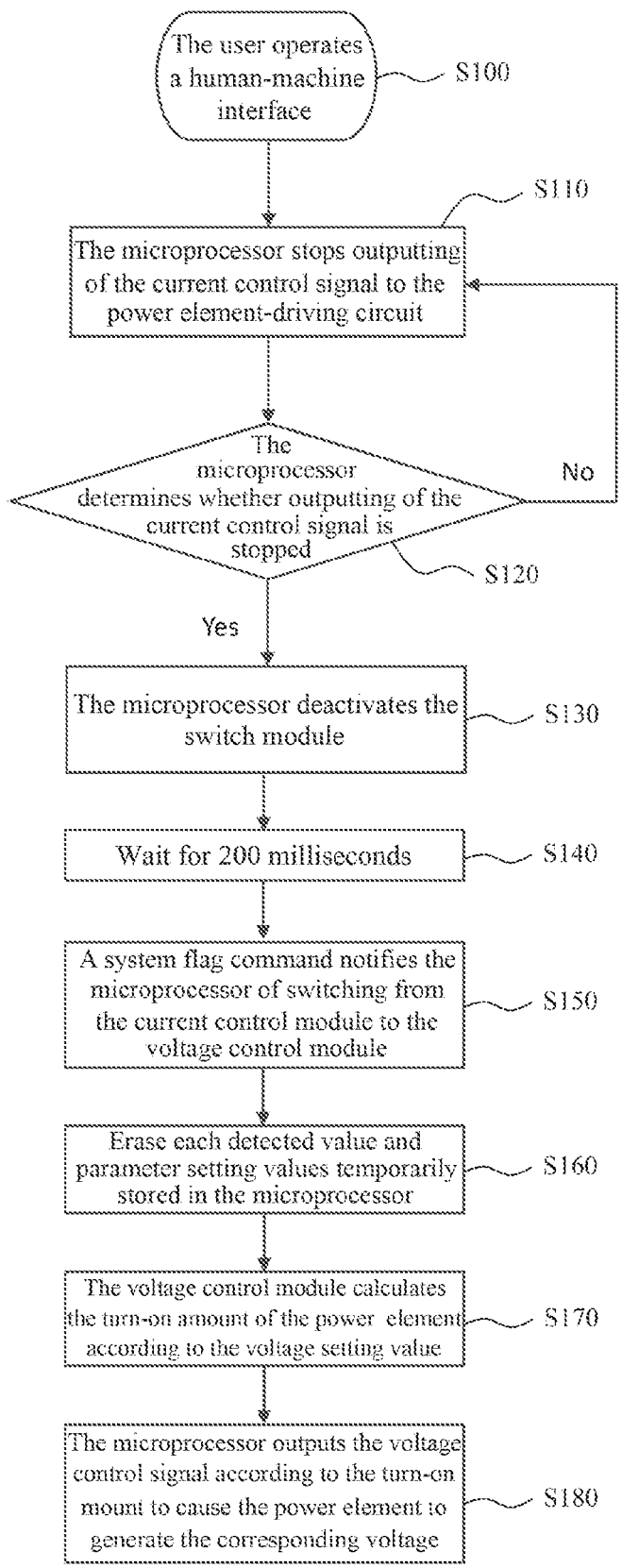
FIG. 4 is a flow chart of switching from the electronic load mode to the power supply mode according to a preferred embodiment of the present invention.

Reference is made to FIG. 4, which shows a flow chart of switching from the electronic load mode to the power supply mode according to a preferred embodiment of the present invention. As shown in the figure, first, the user executes a switching action through a human-machine interface such as a physical button, a touch screen, or a mouse and a keyboard of a computer (the step S100). Next, the microprocessor 40 stops outputting of the current control signal to the power element-driving circuit 42 (the step S110). The microprocessor 40 determines whether outputting of the current control signal is stopped (the step S120). If outputting of the current control signal is not stopped, then the process proceeds to the step S110 for stopping outputting of the current control signal.

If outputting of the current control signal is stopped, the process proceeds to the step S130. In the step S130, the microprocessor 40 deactivates the switch module 5 so that the DC/AC conversion module 4 is disconnected from the device under test Ot. Next, the microprocessor 40 counts and waits for 200 milliseconds so as to ensure complete disconnection (the step S140). A system flag command notifies the microprocessor 40 of switching from the current control module 402 to the voltage control module 401, that is, disabling the current control module 402 and enabling the voltage control module 401 (the step S150). At the same time, the microprocessor 40 resets each detected value and parameter setting values temporarily stored therein, that is, the setting values and the related parameters temporarily stored in the microprocessor 40 are erased (the step S160).

Then, the user can input the voltage setting value Vu, which is the voltage value to be output in the power supply mode, through the human-machine interface; and the voltage control module 410 can calculate the turn-on amount of the power element 41 according to the voltage setting value Vu, that is, the voltage control module 410 calculates the duty ratio of each switching element in the power element 41 through the function operation and the steady-state error compensation (the step S170). Finally, the microprocessor 40 outputs the corresponding voltage control signal to the power element-driving circuit 42 according to the value calculated in the previous step, the power element-driving circuit 42 drives the power element 41 according to the corresponding voltage control signal, and the DC/AC conversion module 4 can output the corresponding voltage equal to the voltage setting value Vu to the device under test Ot (the step S180).

Figure 5:
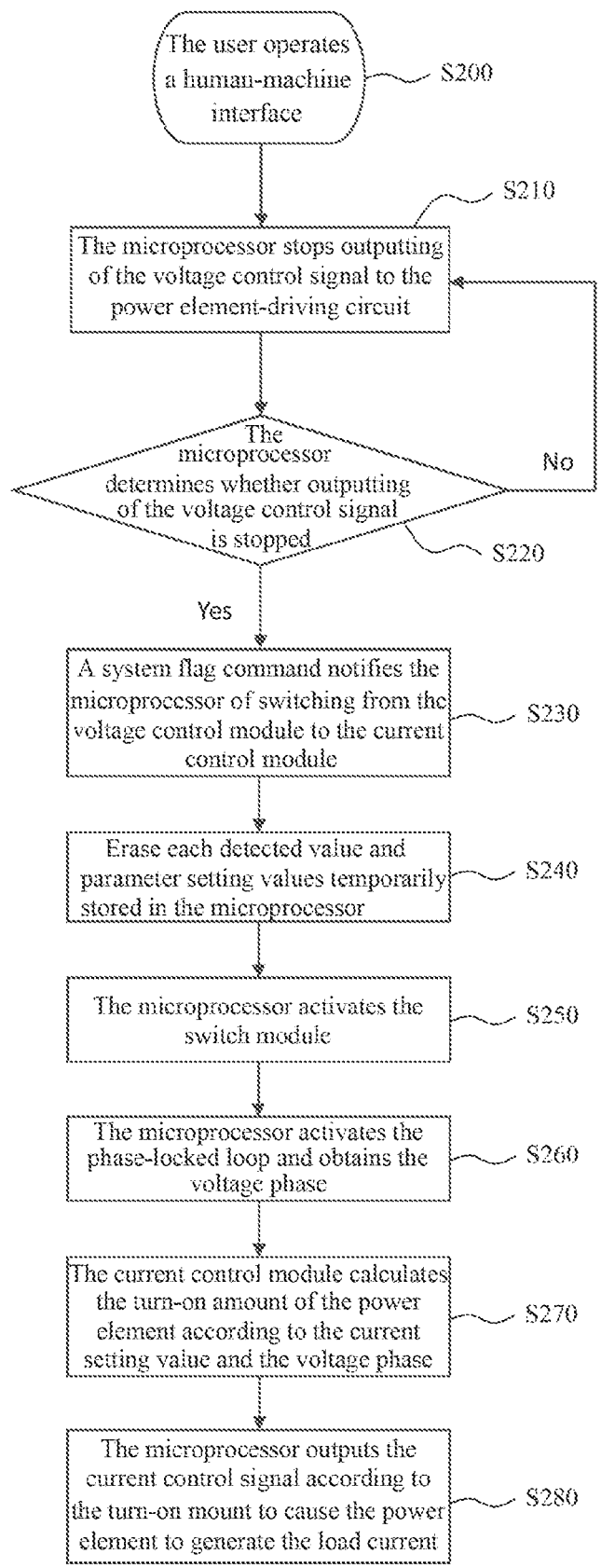
FIG. 5 is a flow chart of switching from the power supply mode to the electronic load mode according to a preferred embodiment of the present invention.

Reference is made to FIG. 5, which shows a flow chart of switching from the power supply mode to the electronic load mode according to a preferred embodiment of the present invention. As shown in the figure, first, the user executes a switching action through a human-machine interface (the step S200). Next, the microprocessor 40 stops outputting of the voltage control signal to the power element-driving circuit 42 (the step S210). The microprocessor 40 determines whether outputting of the voltage control signal is stopped (the step S220). If outputting of the voltage control signal is not stopped, the process proceeds to the step S210 for stopping outputting of the voltage control signal.

If it is determined by the microprocessor 40 that outputting of the voltage control signal is stopped, the process proceeds to the step S230. In the step S230, a system flag command notifies the microprocessor 40 of switching from the voltage control module 401 to the current control module 402, that is, disabling the voltage control module 401 and enabling the current control module 402. At the same time, the microprocessor 40 resets each detected value and parameter setting values temporarily stored therein, that is, the setting values and the related parameters temporarily stored in the microprocessor 40 are erased (the step S240). Next, the process proceeds to the step S250. In the step S250, the microprocessor 40 activates the switch module 5 so that the DC/AC conversion module 4 is connected to the device under test Ot.

When the switch module 5 is activated, the microprocessor 40 receives the input voltage value detected in real time by the voltage-detecting circuit 43 and activates the phase-locked loop 403 to process the input voltage value so as to obtain the voltage phase (the step S260). At the same time, the system receives the current setting value Au input by the user, which is the load current in the electronic load mode. Then, the current control module 402 can calculate the turn-on amount of the power element 41, which is the duty ratio of each switching element in the power element 41, through the function operation and the steady-state error compensation according to the voltage phase obtained by the phase-locked loop 403 and the current setting value Au (the step S270). Finally, the microprocessor 40 outputs the PWM current control signal to the power element-driving circuit 42 according to the turn-on amount, and the power element-driving circuit 42 outputs a matching voltage Vp to the power element 41 so that the power element 41 generates the load current (the step S280).

As can be seen from the switching process described above, this embodiment can switch between the AC/DC power supply mode and the AC/DC electronic load mode in a digital control manner without the system being shut down. More importantly, during the mode switching process, it is not necessary to change any hardware configuration. The user can switch the mode simply by operating the human-machine interface, so the mode switching process is quite simple and convenient for the user.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. An integrated power system capable of switching between a power supply mode and an electronic load mode, comprising:
   an AC/DC conversion module, electrically coupled to an external power source;
   a DC/DC conversion module, electrically coupled to the AC/DC conversion module; and
   a DC/AC conversion module, electrically coupled to the DC/DC conversion module and a device under test; wherein the DC/AC conversion module includes a microprocessor, a power element, a power element-driving circuit, a voltage-detecting circuit and a current-detecting circuit; the power element-driving circuit is electrically coupled to the microprocessor and the power element and the power element-driving circuit is controlled to drive the power element; the power element is electrically coupled to the device under test; the voltage-detecting circuit and the current-detecting circuit are electrically coupled between the power element and the device under test;
   wherein in the power supply mode, the microprocessor controls the power element-driving circuit according to a voltage setting value so that the power element inputs a corresponding voltage to the device under test, and the voltage-detecting circuit and the current-detecting circuit monitor an output voltage value and an output current value output to the device under test respectively and feed the output voltage value and the output current value to the microprocessor;
   wherein in the electronic load mode, the microprocessor controls the voltage-detecting circuit to detect an input voltage value input by the device under test, the microprocessor obtains a voltage phase according to the input voltage value, the microprocessor controls the power element-driving circuit according to a current setting value and the voltage phase so that the power element generates a load current for the device under test.

2. The integrated power system of claim 1, wherein the microprocessor includes a voltage control module; in the power supply mode, the voltage control module calculates a turn-on amount of the power element according to the voltage setting value and outputs a voltage control signal to the power element-driving circuit so that the power element-driving circuit controls the power element to output the corresponding voltage.

3. The integrated power system of claim 2, wherein the microprocessor further includes a current control module and a phase-locked loop; in the electronic load mode, the microprocessor obtains the voltage phase through the phase-locked loop, calculates the turn-on amount of the power element according to the current setting value and the voltage phase through the current control module, and outputs a current control signal to the power element-driving circuit so that the power element-driving circuit outputs a matching voltage to the power element, and the power element generates the load current.

4. The integrated power system of claim 3, further comprising a switch module, which is electrically coupled between the DC/AC conversion module and the device under test; the microprocessor activates the switch module so that the DC/AC conversion module is connected to the device under test, or the microprocessor deactivates the switch module so that the DC/AC conversion module is disconnected from the device under test.

5. The integrated power system of claim 4, wherein when the integrated power system switches from the power supply mode to the electronic load mode, the microprocessor deactivate the power element through the power element-driving circuit; the microprocessor activates the current control module and the switch module, and the phase-locked loop of the microprocessor is activated to calculate the voltage phase; the current control module calculates the turn-on amount of the power element according to the current setting value and the voltage phase, and the microprocessor causes the power element to generate the load current for the device under test through the power element-driving circuit.

6. The integrated power system of claim 4, wherein when the integrated power system switches from the electronic load mode to the power supply mode, the microprocessor deactivates the power element through the power element-driving circuit; the microprocessor deactivates the switch module, and after a certain time period elapses, the microprocessor activates the voltage control module; the voltage control module calculates the turn-on amount of the power element according to the voltage setting value, and the microprocessor causes the power element to input the corresponding voltage to the device under test through the power element-driving circuit.

7. The integrated power system of claim 3, further comprising a current signal-amplifying circuit and a voltage signal-amplifying circuit, the current signal-amplifying circuit being electrically coupled between the current-detecting circuit and the microprocessor, and the voltage signal-amplifying circuit being electrically coupled between the voltage-detecting circuit and the microprocessor.

8. A method for switching an integrated power system between a power supply mode and an electronic load mode, wherein the integrated power system includes a DC/AC conversion module, which is electrically coupled to a device under test, the DC/AC conversion module includes a microprocessor and a power element, and the microprocessor includes a voltage control module, a current control module and a phase-locked loop,
   wherein for switching from the power supply mode to the electronic load mode, the method comprises the steps of:
   (A1) deactivating the power element by the microprocessor;
   (A2) activating the current control module;
   (A3) activating the phase-locked loop by the microprocessor and obtaining a voltage phase of the device under test;
   (A4) calculating the turn-on amount of the power element according to a current setting value and the voltage phase by the current control module; and
   (A5) causing the power element to generate a load current for the device under test by the microprocessor,
   wherein for switching from the electronic load mode to the power supply mode, the method comprises the steps of:
   (B1) deactivating the power element by the microprocessor;
   (B2) activating the voltage control module;
   (B3) calculating the turn-on amount of the power element according to a voltage setting value by the voltage control module; and
   (B4) causing the power element to input a corresponding voltage to the device under test by the microprocessor.

9. The method of claim 8, wherein the DC/AC conversion module further includes a power element-driving circuit, which is electrically coupled between the microprocessor and the power element; in the step (A1) and the step (B1), after the microprocessor stops inputting a control signal to the power element-driving circuit, the microprocessor determines whether the control signal input to the power element-driving circuit is stopped, and if the control signal is not stopped, the step (A1) and the step (B1) are repeated, and if the control signal is stopped, the method proceeds to the step (A2) and the step (B2); in the step (A5), the microprocessor outputs a current control signal to the power element-driving circuit according to the turn-on amount obtained in the step (A4) so as to cause the power element to generate the load current for the device under test; in the step (B4), the microprocessor outputs a voltage control signal to the power element-driving circuit according to the turn-on amount obtained in the step (B3) so as to cause the power element to input the corresponding voltage to the device under test.

10. The method of claim 8, wherein the integrated power system further includes a switch module, which is electrically coupled between the DC/AC conversion module and the device under test; the switch module is controlled to be activated so that the DC/AC conversion module is connected to the device under test or to be deactivated so that the DC/AC conversion module is disconnected from the device under test; in the step (A2), after activating the current control mode and erasing all of parameters temporarily stored in the microprocessor, the microprocessor activates the switch module; in the step (B2), the microprocessor deactivates the switch module, and after a certain time period elapses, the microprocessor activates the voltage control module and erases all of the parameters.

\* \* \* \* \*